(12) United States Patent
Yamauchi et al.

(10) Patent No.: US 7,910,842 B2
(45) Date of Patent: Mar. 22, 2011

(54) EL LIGHT EMITTING TOUCH SWITCH

(75) Inventors: Kazuto Yamauchi, Okazaki (JP);
Yasunori Murayama, Ichinomiya (JP);
Sadahiko Tanaka, Okazaki (JP);
Keitaro Takizawa, Okazaki (JP);
Kouichi Yamanoue, Yokohama (JP)

(73) Assignees: Mitsubishi Jidosha Kogyo Kabushiki Kaisha, Tokyo (JP); Visteon Japan, Ltd., Yokohama-Shi (JP)

( * ) Notice: Subject to any disclaimer, the term of this patent is extended or adjusted under 35 U.S.C. 154(b) by 342 days.

(21) Appl. No.: 12/109,143

(22) Filed: Apr. 24, 2008

(65) Prior Publication Data

US 2008/0265788 A1 Oct. 30, 2008

(30) Foreign Application Priority Data

Apr. 27, 2007 (JP) ................... 2007-118918

(51) Int. Cl.
*H01H 21/22* (2006.01)
(52) U.S. Cl. ................ 178/110; 345/173; 323/904
(58) Field of Classification Search .............. 323/904; 345/173; 178/110
See application file for complete search history.

(56) References Cited

U.S. PATENT DOCUMENTS

| | | | |
|---|---|---|---|
| 4,237,421 A | 12/1980 | Waldron | |
| 4,561,002 A | 12/1985 | Chiu | |
| 5,867,111 A | 2/1999 | Caldwell et al. | |
| 7,154,483 B2 * | 12/2006 | Kobayashi | 345/173 |
| 7,242,393 B2 * | 7/2007 | Caldwell | 345/173 |
| 7,445,350 B2 * | 11/2008 | Konet et al. | 362/84 |
| 2008/0030465 A1 * | 2/2008 | Konet et al. | 345/158 |

FOREIGN PATENT DOCUMENTS

| | | |
|---|---|---|
| EP | 0134979 A2 | 3/1985 |
| FR | 2439509 A1 | 5/1980 |
| GB | 2059657 A | 4/1981 |
| JP | 54-134377 A | 10/1979 |
| JP | 55-78232 A | 5/1980 |
| JP | 5-135654 A | 6/1993 |
| JP | 3284259 B2 | 3/2002 |

* cited by examiner

*Primary Examiner* — Thuy Vinh Tran
(74) *Attorney, Agent, or Firm* — Birch, Stewart, Kolasch & Birch, LLP

(57) ABSTRACT

A touch switch is composed of an EL light emitting layer configured by stacking a fluorescent layer and an insulation layer between first electrodes and a second electrode, a judgment unit for making a judgment on touch manipulation with the first electrode by an operator and an EL driving unit for driving the EL light emitting layer for light emitting, with each of a plurality of first electrodes, each of plurality of fluorescent layers and each of plurality of insulation layers being provided as a set and the second electrode being provided as a single electrode with respect to the plurality of first electrodes, wherein the judgment unit makes a judgment on which of the plurality of first electrodes has been touched by an operator on the basis of a high-frequency component inputted from the second electrode through the first electrode each time the touch switch is touched by an operator.

11 Claims, 8 Drawing Sheets

EL LIGHT EMITTING TOUCH SWITCH

BACKGROUND OF THE INVENTION (1) Field of the Invention

This present invention relates to an EL (Electro Luminescence) light emitting touch switch having a plurality of touch detection electrodes, and more particularly to an EL (Electro Luminescence) light emitting touch switch suitable for use in a control panel for devices in the interior of an automobile.

(2) Description of the Related Art

So far, there has widely known a touch switch designed to, when a portion of a human body comes into contact with or comes close to a conductive electrode member, detect this state for placing a desired device into operation. Even in a case in which the electrode member functions as an electrostatic capacitance sensor, such a touch switch is made to read a variation in impedance of the electrode when the human body comes into contact with the electrode, thereby detecting the on/off-state of the touch switch.

Meanwhile, as such a touch switch, there has been known a structure in which an electrode designed to detect the contact with a human body is formed on an organic or inorganic EL (Electro Luminescence) element made to emit light from a fluorescent material so as to achieve the switch thickness reduction and the switch size reduction (for example, see Japanese Patent Laid-Open No. HEI 5-135654 (D1)).

FIG. 6 is an illustration of one example of illustrative cross-sectional view showing a structure of such a touch switch, where the reference numeral 100 designates a transparent insulation substrate. Moreover, a transparent electrode 102 is provided on a surface (upper surface) of this transparent insulation substrate 100 and a transparent insulation film (coat) 101 is put thereon, thereby forming a touch surface.

In addition, an EL light emitting layer 103 is formed on a rear surface (lower surface) of the transparent insulation substrate 100. This EL light emitting layer 103 is formed by stacking up a transparent electrode 103a, a fluorescent layer 103b, an insulation layer 103c and a back electrode 103d in a downward direction from the insulation substrate 100 side. The light emitting takes place from the fluorescent layer 103b in a manner such that an alternating-current electrical field is applied between the electrodes 103a and the 103d.

Since this light reaches the external through the transparent electrode 103a, the transparent insulation substrate 100, a touch detection transparent electrode 102 and the transparent insulation film 101, an operator can touch the insulation film 101 by his/her fingertip by the help of this light emitting. In addition, when the fingertip comes into contact with the insulation film 101, a touch judgment circuit (not shown) connected to the detection transparent electrode 102 senses a variation in impedance or a variation in capacitance so as to judge the occurrence of the touch and further carry out the on-off control on devices (for example, air conditioner and audio device) connected thereto.

However, since such a touch switch composed by the pair of electrodes 103a and 103d, which drives the EL light emitting layer for the light emitting, and the touch detection electrode 102, face difficulty in achieving reduction of the switch thickness and an increase in cost caused by an increase in the number of electrode layers to be stacked up.

Accordingly, for solving these problems, Japanese Patent Publication No. 3284259 (D2) discloses an EL light emitting touch switch capable of achieving the switch thickness reduction by using a touch detection electrode and an EL driving electrode in common.

Concretely, as shown in FIG. 7, a touch switch SW includes an EL light emitting layer 1 configured by piling up a fluorescent layer 1b and an insulation layer 1c between a transparent electrode (which is equally referred to as a "surface electrode") 1a and a back electrode 1d, and is made by forming the EL light emitting layer 1 on an insulation substrate 3 and further forming a transparent insulating film 2 thereon. In this case, the surface electrode 1 combines a function as a touch detection electrode and a function as an EL driving electrode.

Furthermore, as shown in FIG. 7, a touch judgment circuit 10 designed to detect a variation in the electric potential of the transparent electrode 1a of the EL light emitting layer 1 for detecting the contact of an operator with the transparent insulation film 2 and an EL driving circuit 11 made to output an alternating-current voltage with reference to an electric potential of the transparent electrode 1a for carrying out the light emitting of the EL light emitting layer 1 are placed in parallel on this touch switch SW.

Still furthermore, in addition to the touch judgment circuit 10 and the EL driving circuit 11, this touch switch SW is equipped with a drive control circuit 12, and the touch judgment circuit 10 is operated by a control signal from the drive control circuit 12. The touch judgment circuit 10 is designed to detect the contact of a finger with the transparent insulation film 2 on the basis of a variation in electric potential between an electric potential VA of the transparent electrode 1a and a ground electric potential VG. When the touch judgment circuit 10 has made a touch judgment, it drives an on-off state of the EL driving circuit 11 to apply an alternating-current electrical field between both the electrodes 1a and 1d for controlling the light emitting of the EL light emitting layer 1.

Meanwhile, it is considered to employ such a touch switch in a control panel for equipment (concretely, an audio device or an air conditioner in an automobile) in the interior of an automobile.

However, because the technique disclosed in D1 cannot reduce the thickness, it is not suitable for a control panel in an automobile. Moreover, although the technique disclosed in the Patent Document 2 does not create a problem when the touch detection electrode (transparent electrode 1a) is one in number, in a case in which a plurality of touch electrodes 1a exist on a single panel, for example, a control panel for devices in an automobile, the technique disclosed in the D2 does not function as an effective solving means.

That is, in an EL panel having many independent light emitting portions (in this case, they correspond to the fluorescent layer 1c), a common manner is such that the back electrode 1d is formed to have an area covering all the light emitting portions and is made as a common electrode. However, in the EL panel having this configuration, as disclosed in the D2, in case that an EL driving circuit is connected with reference to the transparent electrode 1a which also serves as a touch detection electrode, that is, the back electrode 1d is configured so as to float with respect to a ground electrode, a large electrostatic capacitance exists at the independent light emitting portions, i.e., between the transparent electrode 1a and the back electrode 1d. When a finger comes into contact with any one of a plurality of touch electrodes, all the switches detect the touch simultaneously (see FIG. 8).

SUMMARY OF THE INVENTION

The present invention has been developed in consideration of these problems, and it is therefore an object of the invention to provide an EL light emitting touch switch which has a plurality of surface electrodes each combining a function as a touch detection electrode and a function as an EL driving electrode and a single (common) back electrode and which is capable of eliminating the interaction between the surface electrodes to enable an accurate touch judgment in a state where the respective surface electrodes are independent of each other.

For this purpose, in accordance with the present invention, an EL light emitting touch switch comprises an EL light emitting layer configured by stacking a plurality of first electrodes, a second electrode placed in confronting relation to the plurality of first electrodes and provided in the form of a single electrode with respect to the plurality of first electrodes, fluorescent layers and insulation layers placed in confronting relation to the first electrodes between the first electrodes and the second electrode, and judgment means for making a judgment on which of the plurality of first electrodes has been touched by an operator on the basis of a high-frequency component inputted from the second electrode through the first electrodes.

In addition, preferably, the EL light emitting touch switch further comprises EL driving means connected to the judgment means for driving the EL light emitting layer for light emitting, an EL driving power supply connected between the second electrode and the EL driving means, a high-frequency signal source connected in series between the EL driving power supply and the ground electric potential for outputting a signal with a higher frequency than that of the EL driving power supply, a first filter connected between each of the first electrodes and the EL driving power supply and made to pass an output of the EL driving power supply, and a second filter connected between each of the first electrodes and the judgment means and made to pass an output of the high-frequency signal source.

Thus, with respect to an EL light emitting touch switch comprising a plurality of surface electrodes each combining a function as a touch detection electrode and a function as an EL driving electrode and a single (common) back electrode, there is an advantage that the interaction between the surface electrodes is eliminable so as to enable an accurate touch judgment on the surface electrode. Therefore, the EL light emitting touch switch becomes applicable to a panel carrying a plurality of switches, such as a control panel (instrument panel) for devices in the interior of an automobile.

Still additionally, preferably, the EL light emitting touch switch further comprises EL driving means connected to the judgment means for driving the EL light emitting layer for light emitting, an EL driving power supply connected between the second electrode and the EL driving means, and a high-frequency signal source connected between the second electrode and the judgment means for outputting a signal with a higher frequency than that of the EL driving power supply, wherein the EL driving means has a function as an on-off switch which repeatedly on-off controls a connection state between the first electrode and the EL driving power supply, and the judgment on the electrode touch by the operator is made on the basis of a variation of a high-frequency signal from the high-frequency signal source when the on-off switch is in an off state.

With this configuration, a filter such as LPF and HPF is omissible, which leads to a simple structure.

Yet additionally, preferably, the EL light emitting touch switch further comprises EL driving means connected to the judgment means for driving the EL light emitting layer for light emitting, an EL driving power supply connected between the second electrode and the EL driving means for driving the EL light emitting layer for light emitting and for generating a rectangular wave, a first filter connected between each of the first electrodes and the EL driving power supply for passing an output of the EL driving power supply and a second filter connected between each of the first electrodes and the judgment means.

This configuration enables the judgment of the touch operation by the operator without employing a touch judgment high-frequency signal source, which leads to a simpler structure.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DESCRIPTION OF THE PREFERRED EMBODIMENTS

Figure 1:
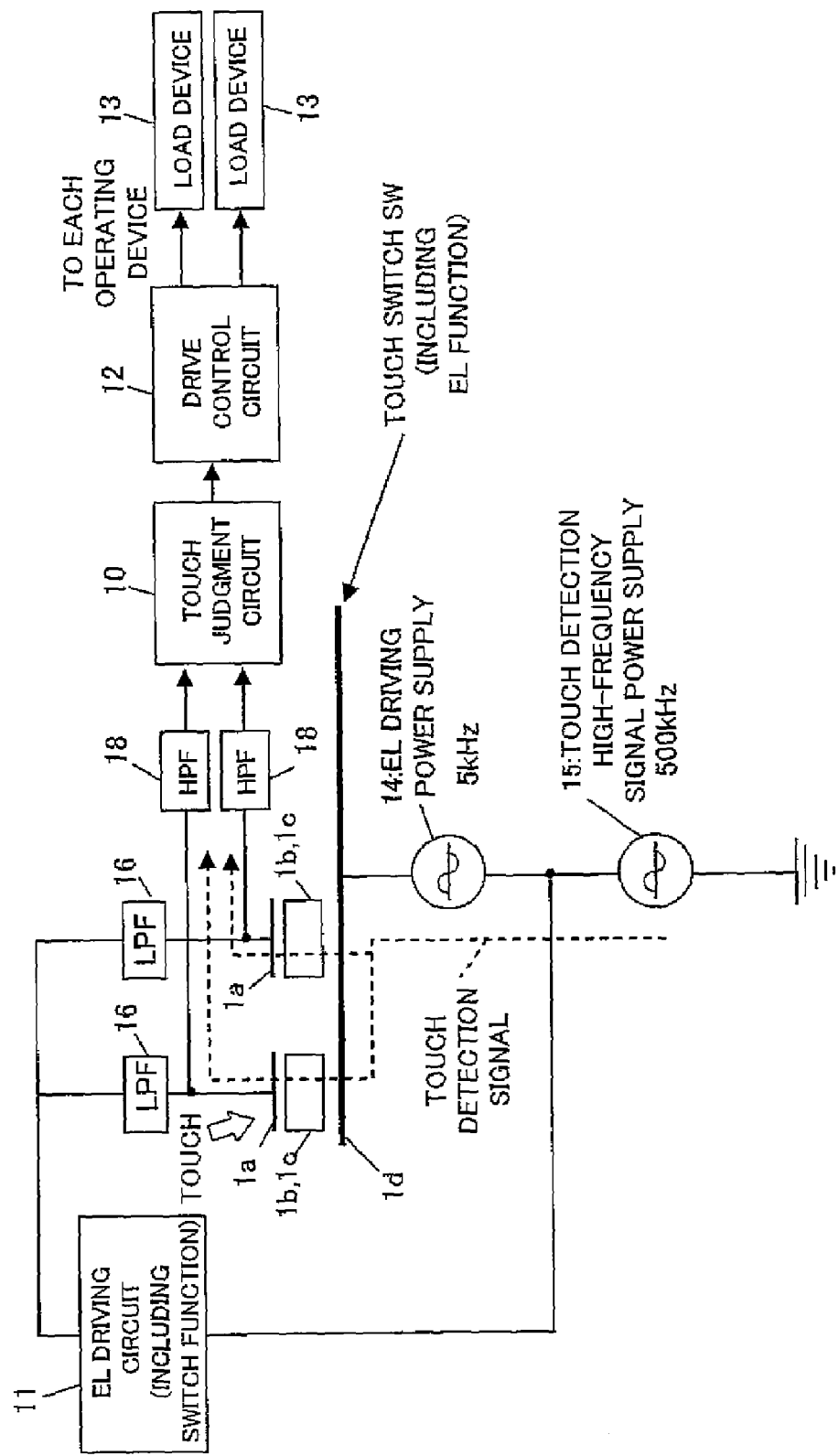
FIG. 1 is an illustrative block diagram showing an entire configuration of an EL light emitting touch switch according to a first embodiment of the present invention.

Referring to the drawings, a description will be given hereinbelow of an EL light emitting touch switch according to a first embodiment of the present invention. FIG. 1 is an illustrative block diagram showing the entire configuration thereof, and FIG. 2 is a cross-sectional view showing one example of a structure of the EL light emitting touch switch.

Figure 2:
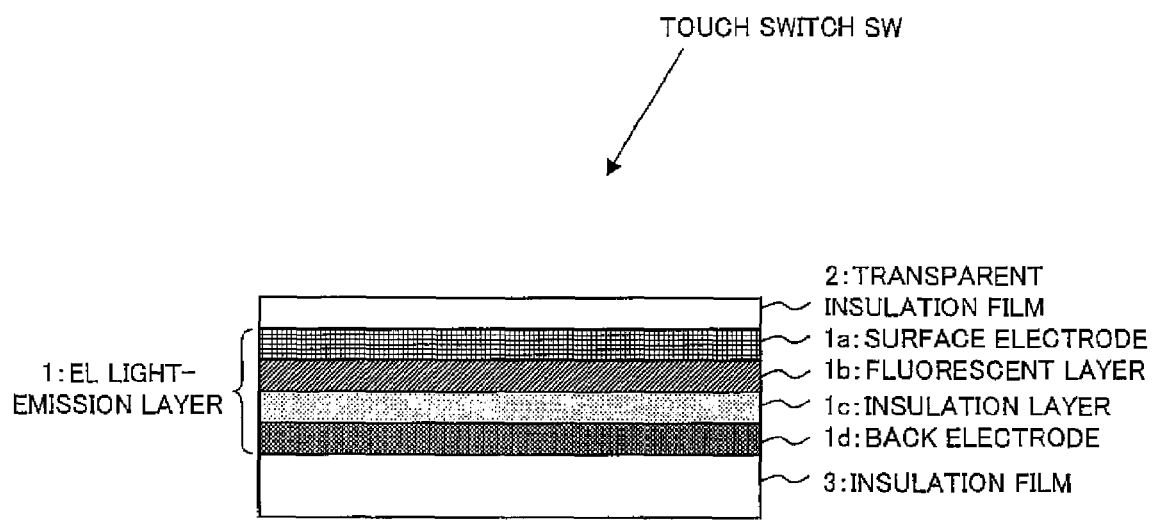
FIG. 2 is a cross-sectional view showing one example of an EL light emitting touch switch according to the first embodiment of the present invention.

As shown in FIG. 2, this EL light emitting touch switch SW is composed of an EL light emitting layer (equally referred to as an "EL panel") 1 formed on an insulation substrate 3 and a transparent insulation film (coat) 2 formed on the EL light emitting layer 1. The EL light emitting layer 1 is structured by stacking (piling up) a fluorescent layer 1b and an insulation layer 1c in the order from the side of surface electrodes (first electrodes) 1a between the surface electrode 1a and a back electrode (second electrode) 1d. In a manner such that an alternating-current electrical field is applied between both the electrodes 1a and 1d, a light emitting takes place from the fluorescent layer 1b so that the light emitting from the surface of the touch switch SW occurs through the surface electrodes 1a and the transparent insulation film 2.

In this configuration, the transparent insulation film 2 is resin-coated for the purpose of preventing the damages or stains on the surface electrodes 1a. Moreover, the surface electrodes (transparent electrodes) 1a combine a function as a touch detection electrode for detecting an operation by an operator and a function as an EL driving electrode for making the fluorescent layer 1b emit light in response to the application of an alternating-current electrical field. Still moreover, the fluorescent layer 1b is formed by dispersing, in a binder having a high dielectric constant, fluorescent material grains that emit light when an alternating-current electrical field is applied thereto.

A touch surface of the touch switch SW is configured in this way, while, as shown in FIG. 1, there are provided a touch judgment circuit (judgment means) 10, an EL driving circuit (driving means) 11 and a drive control circuit 12, which are electrically connected to the touch switch SW.

In FIG. 1, the description about the transparent insulation film 2 and the insulation substrate 3 in the above-mentioned touch switch SW will be omitted because of no relation with the spirit of the present invention.

The touch judgment circuit 10 is designed to detect the contact of an operator with the transparent insulation film 2 on the basis of an attenuation of a high-frequency signal supplied to the touch switch SW [a difference (variation of |VA-VG|) between the electric potential of the surface electrode 1a of the EL light emitting layer 1 and the ground electric potential VG], and this judgment result is outputted to the drive control circuit 12.

Moreover, when the touch judgment circuit 10 detects the touch operation by the operator, the drive control circuit 12 controls an operation of a load device (for example, air conditioner or audio equipment) 13 or the like which corresponds to the switch touched.

Therefore, when an operator's fingertip or the like comes into contact with a surface (surface electrode 1a side) of the touch switch SW, the touch judgment circuit 10 judges this contact, and the drive control circuit 12 controls an operation of the load device 13.

As shown in FIG. 1, according to this embodiment, a plurality of surface electrodes 1a (in this embodiment, two surface electrodes 1a) are provided which are made to operate independently of each other. This produces a plurality of touch switches SW. Moreover, for example, one switch SW functions as an on-off switch for an air conditioner while the other switch SW functions as an on-off switch for an audio device.

In addition, as illustrated, the back electrode 1d of the touch switch SW is provided as a common electrode with respect to each of the surface electrodes 1a, and an EL driving power supply 14 having a predetermined frequency (5 kHz) is connected to this back electrode 1d.

In this case, the EL driving power supply 14 is an alternating-current power supply for the application to the EL light emitting layer 1 of the touch switch SW and, for example, when a head light switch and small light for an automobile are turned on, the EL driving power supply 14 is operated in conjunction with this turning-on operation and an EL panel (EL light emitting layer) emits light as night illumination.

Still additionally, in series with this EL driving power supply 14, there is connected a touch detection high-frequency signal source (high-frequency power supply) 15 having a predetermined frequency (500 kHz). An alternating current is inputted to the driving circuit 11 between the EL driving power supply 14 and the touch detection high-frequency signal source 15. In this embodiment, although the touch detection high-frequency signal source 15 is made to have a frequency of 500 kHz, it is preferable that the touch detection high-frequency signal source 15 has a frequency which is approximately hundred times that of the EL driving power supply 14 or a frequency higher than it.

Yet additionally, to each of surface electrodes 1a of the touch switches SW, there is connected each of switching circuits which is not shown therein. The function of this switching circuit is built in the EL driving circuit 11 and is turned on at the lighting of the above-mentioned EL light emitting layer 1.

To each of the surface electrodes 1a, in series with the EL driving circuit 11, there is connected each of low-pass filters (LPF) 16 which passes only a low frequency. Only a current with a low frequency which passes through this LPF 16, that is, an EL driving alternating current, is fed to the surface electrode 1a.

Moreover, as illustrated, a high-pass filter (HPF) 18, which is made to pass only a high frequency, is connected between the touch judgment circuit 10 and each of the surface electrodes 1a, so only a high-frequency signal, which has passed through the HPF 18, is inputted to the touch judgment circuit 10.

Secondly, a description will be given of an operation of the touch judgment circuit 10. When the operator touches the surface electrode 1a, a high-frequency signal introduced from the back electrode 1d of the switch touched to the surface electrode 1a is inputted through the EL driving power supply 14 and the high-pass filter 18 to the touch judgment circuit 10. A high-frequency signal from the high-frequency signal source 15 and a low-frequency signal from the EL driving power supply 14 are superimposed in this signal, and when passing through the high-pass filter 18, only the high-frequency signal is extracted from the signal in the superimposed state and is inputted to the touch judgment circuit 10.

The touch judgment circuit 10 is designed to make a judgment on the basis of an attenuation state of this high-frequency signal as to whether or not the operator touches the surface electrode 1a. Moreover, if the attenuation state exceeds a predetermined threshold, the touch judgment circuit 10 makes a judgment that the operator has touched the surface electrode 1a.

In this way, the touch judgment circuit 10 outputs, to the drive control circuit 12, a signal indicative of the surface electrode 1a touched, and the drive control circuit 12 is made to control an operation of a desired device in accordance with the surface electrode 1a undergoing the judgment in the touch judgment circuit 10.

Since the EL light emitting touch switch, according to the first embodiment of the present invention, is configured as described above, in an EL light emitting touch switch comprising a plurality of surface electrodes 1a each combining a function as a touch detection electrode and a function as an EL driving electrode and a single (common) back electrode 1d, as an advantage, the interaction between the surface electrodes 1a is eliminable, which enables accurate touch judgment on the surface electrode 1a. Therefore, the EL light emitting touch switch is applicable to a panel with a plurality of switches, such as a control panel (instrument panel) for devices in the interior of an automobile.

Figure 3:
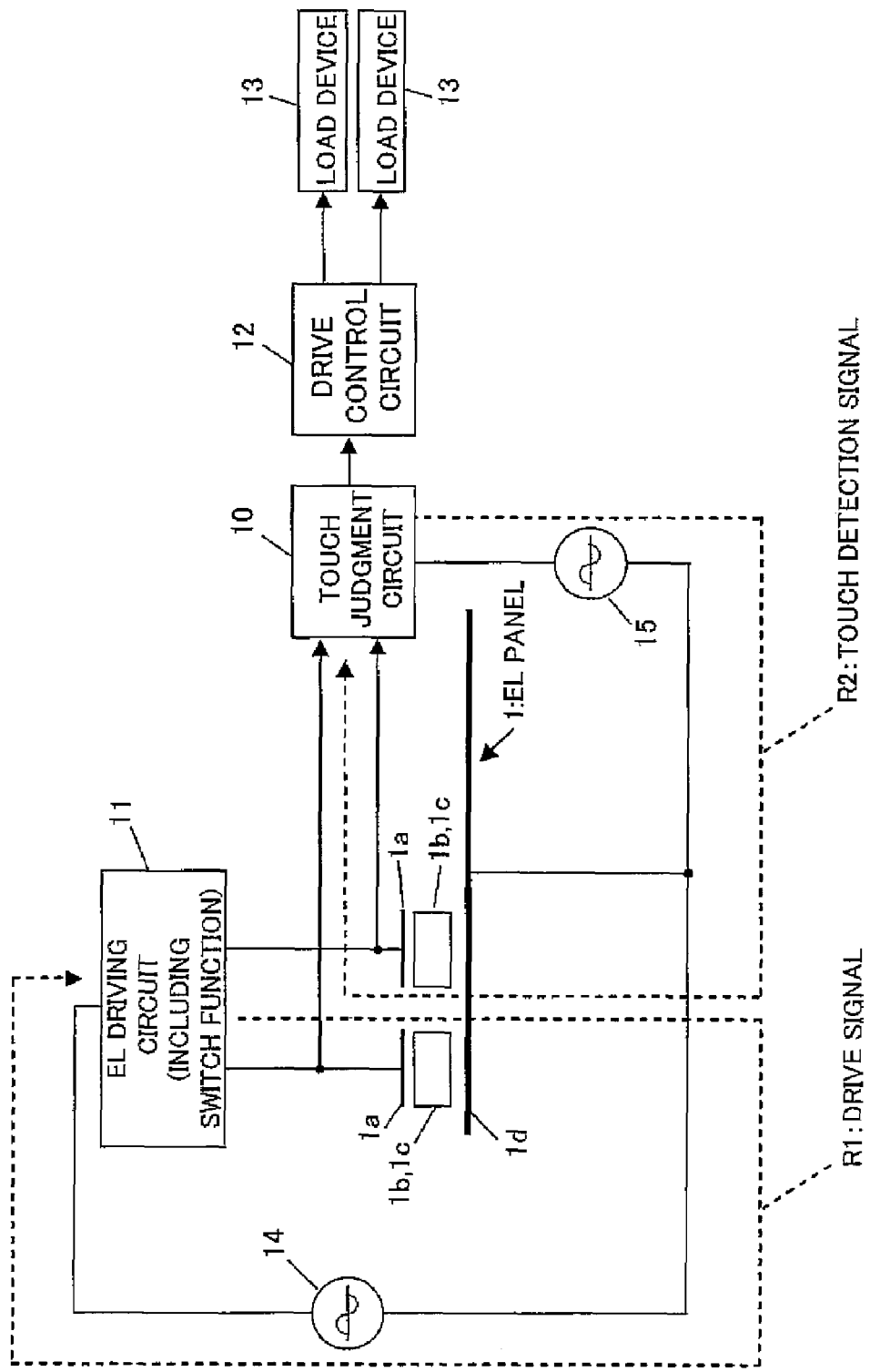
FIG. 3 is an illustrative block diagram showing an entire configuration of an EL light emitting touch switch according to a second embodiment of the present invention.
Figure 4:
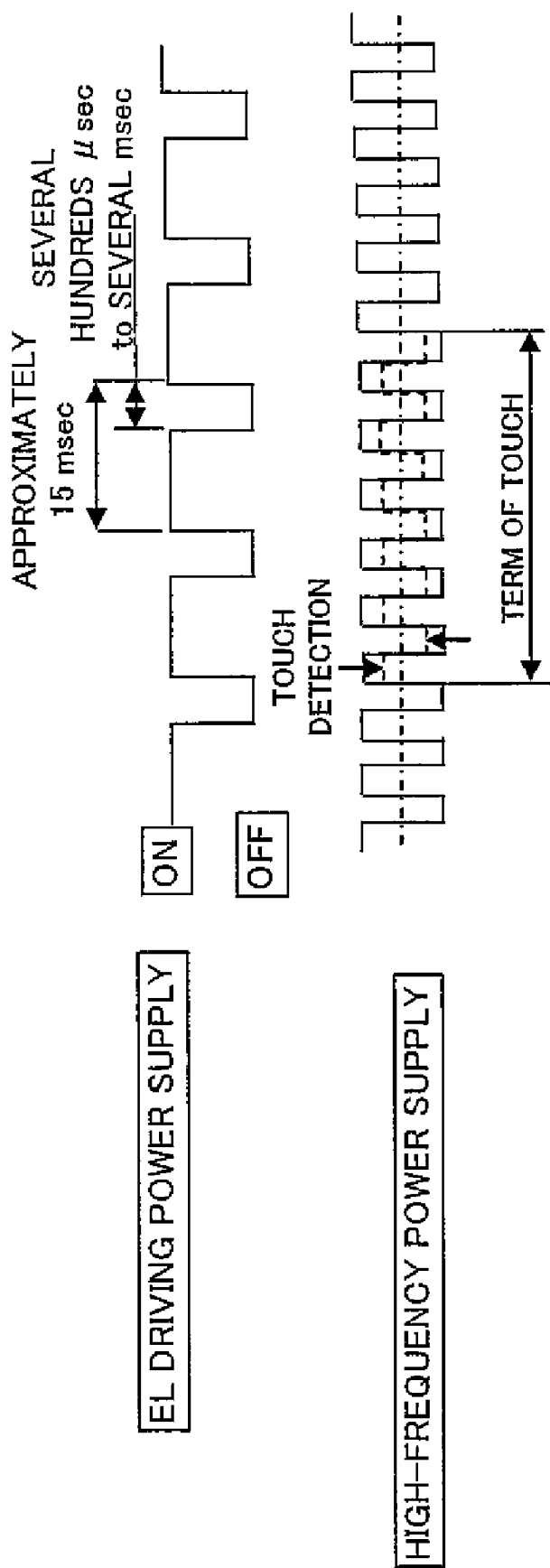
FIG. 4 is a time chart useful for explaining an operation of the EL light emitting touch switch according to the second embodiment of the present invention.

Furthermore, a description will be given hereinbelow of a second embodiment of the present invention. FIG. 3 is an illustrative view showing the entire configuration of the second embodiment, and FIG. 4 is a time chart useful for explaining an operation thereof.

As shown in FIG. 3, as well as the first embodiment, an EL light emitting touch switch, according to this second embodiment, includes a touch judgment circuit 10, an EL driving circuit 11 and a drive control circuit 12. In addition, as in the case of the first embodiment, the EL light emitting touch switch, according to this second embodiment, is equipped with an EL driving power supply 14 and a touch detection high-frequency signal source (high-frequency power supply)

15. The functions of these power supply 14 and 15 are the same as those in the first embodiment.

Furthermore, as illustrated, also in the second embodiment, a plurality of (in this embodiment, two) surface electrodes 1a are provided and made to operate independently of each other. Accordingly, a plurality of touch switches SW are substantially provided as well as the first embodiment.

Still furthermore, as illustrated, the back electrode 1d of the touch switch SW is provided as a common electrode with respect to the respective surface electrodes 1a, and the EL driving power supply 14 and the touch detection high-frequency signal power supply 15 are in connection with this back electrode 1d.

The surface electrode 1a of the touch switch SW is connected to the EL driving circuit 11 including a switching circuit (on-off switch) internally, not shown, and, as well as the circuit mentioned in the first embodiment. This switching circuit repeatedly carries out on-off operations periodically at the lighting of the EL light emitting layer 1.

In addition, when the switching circuit repeats the on-off control at a high speed at the lighting of the EL light emitting layer 1, the EL light emitting layer 1 is controlled to apparently conduct the continuous lighting visually.

Still additionally, the touch judgment circuit 10 is designed to make a judgment on the basis of on-off information in the above-mentioned switching circuit as to which of the surface electrodes 1a undergoes the touch operation. In particular, according to this second embodiment, in the off-state of the switching circuit made to control the EL light emitting layer 1 on-off, this switching circuit is used as an electrode dedicated to the touch detection.

A description will be given hereinbelow with reference to FIG. 4. In the illustration, the upper section shows a signal to be outputted from the EL driving power supply 14 while the lower section indicates a signal to be outputted from the high-frequency power supply 15.

First of all, when the operator touches the surface electrode 1a, a high-frequency signal (for example, 500 kHz) outputted from the high-frequency power supply 15 and inputted to the touch judgment circuit 10 attenuates. Such attenuation of the high-frequency signal continues while the operator touches the surface electrode 1a, and when the operator moves his/her finger apart from the surface electrode 1a, the attenuation thereof stops.

In the EL driving circuit 11, when the switching circuit is in the on state, since a signal to be inputted to the touch judgment circuit 10 is such that a high-frequency signal from the high-frequency power supply 15 is superimposed on a signal from the EL driving power supply 14, the attenuation of the signal from the high-frequency power supply 15 cannot be detected. On the other hand, when the switching circuit is in the off state, the attenuation of the signal from the high-frequency power supply 15 is detectable, which enables a manipulation by the operator to be sensed on the basis of the attenuation condition of the high-frequency power supply 15 (see route R1 in FIG. 3).

With respect to the switching period of the aforesaid switching circuit, the time of one on-signal output is approximately several ten milliseconds, which is at least the frequency lower than that of the high-frequency power supply 15 needed for the detection of the fact that the contact of the operator with the surface electrode 1a.

Moreover, when the signal from the EL driving power supply 14 is in the off state, the detection of the attenuation of the signal from the high-frequency power supply 15 allows a judgment that the touch manipulation has been conducted, thus controlling an operation of a desired device 13.

With this configuration, the touch judgment circuit 10 can make a judgment on which of the plurality of surface electrodes 1a has been manipulated by the operator. Accordingly, it is possible to light or put out the EL light emitting layer 1 corresponding to the surface electrode 1a manipulated and further to accurately control an operation of a device corresponding to this surface electrode 1a of the touch switch SW.

Since the EL light emitting touch switch, according to the second embodiment of the present invention, is configured as described above, as well as the first embodiment, the EL light emitting touch switch comprises a plurality of surface electrodes 1a each combining a function as a touch detection electrode and a function as an EL driving electrode and a single (common) back electrode 1d, and it provides an advantage of eliminating the interaction between the surface electrodes 1a and enabling accurate touch judgment on the surface electrode 1a.

In addition, according to this second embodiment, since a voltage from the EL driving power supply 14 is not applied to the touch judgment circuit 10 at the touch detection timing as mentioned above, the filters such as LPF and HPF, which are used in the first embodiment, are omissible, which allows a simple configuration.

Figure 5:
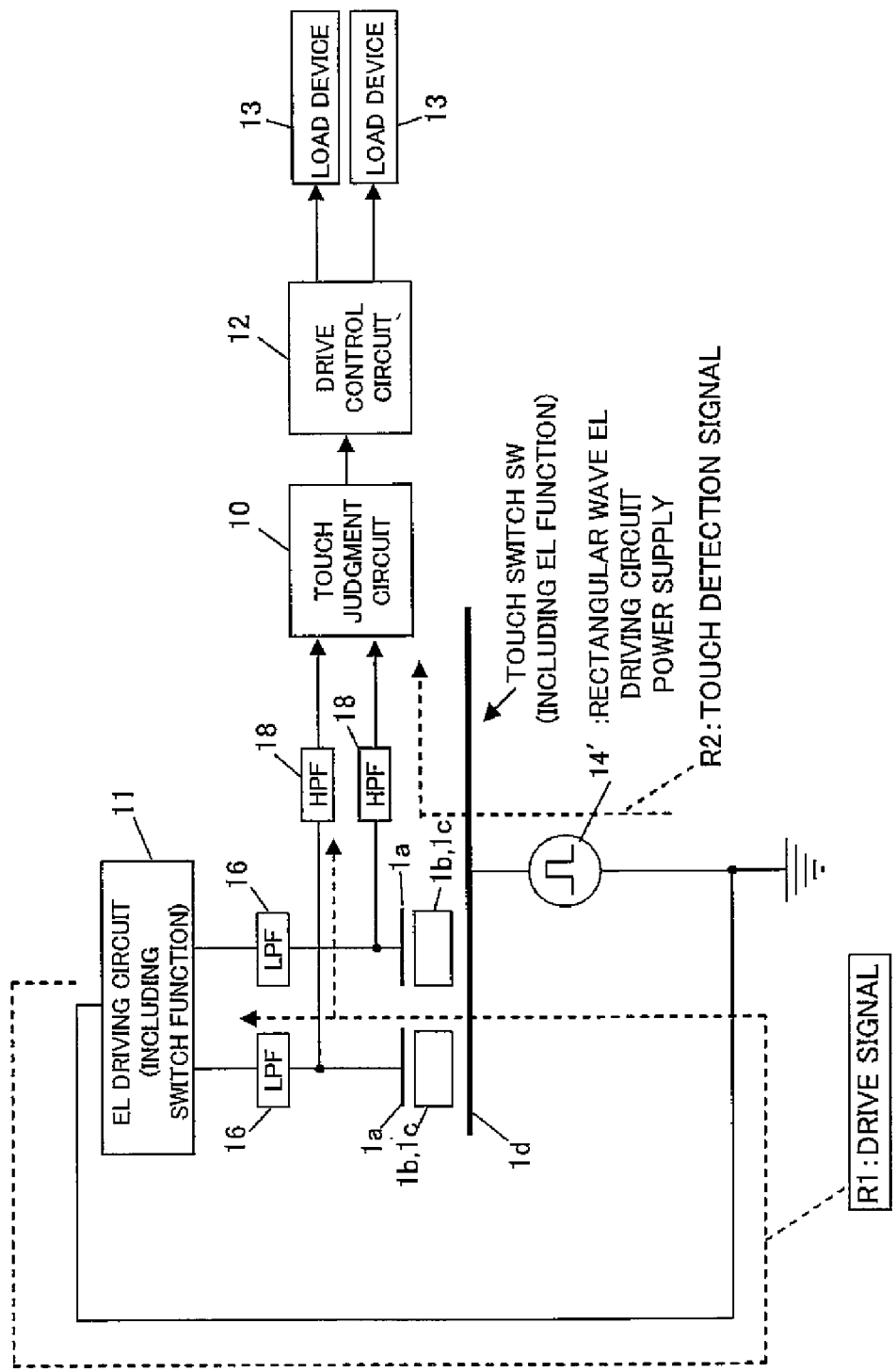
FIG. 5 is an illustrative block diagram showing an entire configuration of an EL light emitting touch switch according to the third embodiment of the present invention.
Figure 6:
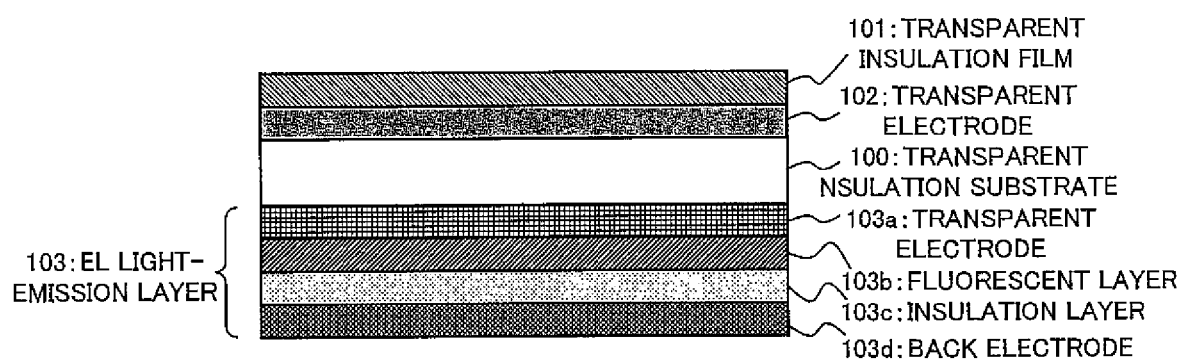
FIG. 6 is an illustration for explaining a conventional technique.
Figure 7:
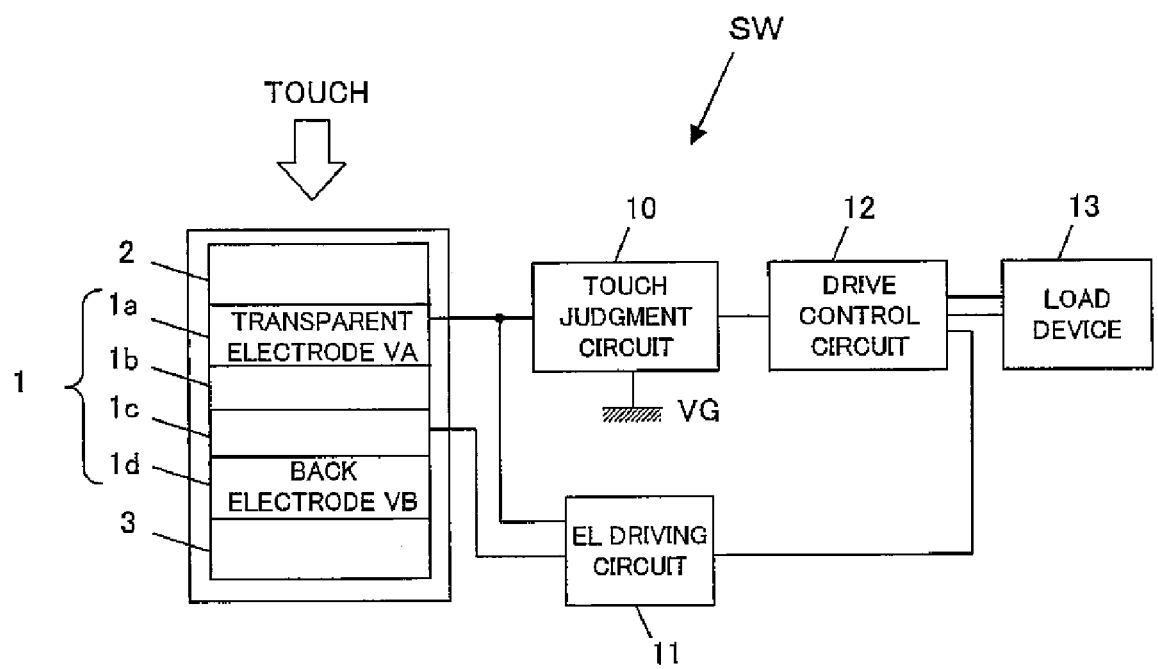
FIG. 7 is an illustration for explaining a conventional technique.
Figure 8:
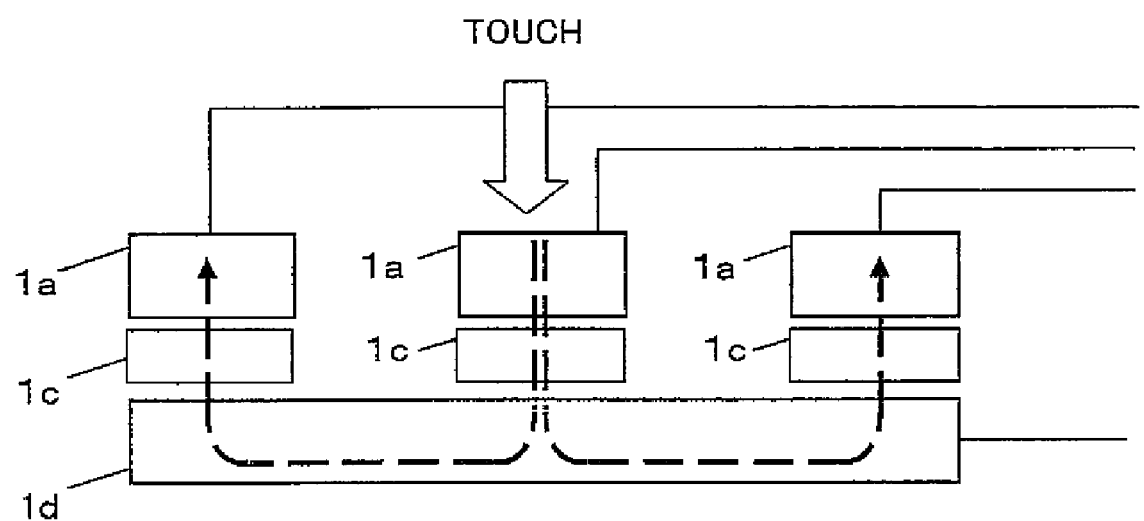
FIG. 8 is an illustration for explaining problems existing in a conventional technique.

Furthermore, a description will be given hereinbelow of a third embodiment of the present invention. FIG. 5 is an illustrative view showing an essential part of the third embodiment. This third embodiment is basically configured like the first embodiment, but the high-frequency signal source for the touch detection, which is used in the first embodiment, is omitted. Moreover, a difference from the first embodiment is that an output signal from an EL driving power supply 14' is a rectangular wave signal instead of a sine wave signal. Other configurations are the same as those in the first embodiment.

Still furthermore, in a case in which the waveform from the EL driving power supply 14' is set as a rectangular wave, when a high-frequency component is superimposed on an EL driving signal and this high-frequency component is introduced into the touch judgment circuit 10, the touch of a fingertip with the surface electrode 1a is detectable on the basis of an attenuation state of this high-frequency component.

Therefore, the EL light emitting touch switch according to this third embodiment can provide advantages similar to those of the first embodiment and the second embodiment and further enables the judgment on the touch manipulation by the operator without employing a high-frequency signal source for the touch detection achieving a simpler configuration unlike the first embodiment.

Although the embodiments of the present invention have been described above, it should be understood that the present invention is not limited to the above-described embodiments, and that it is intended to cover all changes and modifications of the embodiments of the invention herein which do not constitute departures from the spirit and scope of the invention.

For example, an organic or inorganic element is employable as the EL element for the aforesaid EL panel.

In addition, although in the above description the EL light emitting layer 1 is lighted up at the lighting of a head light of an automobile, it is also appropriate to light a switch which has detected the touch by the operator.

What is claimed is:
1. An EL light emitting touch switch comprising:
   an EL light emitting layer configured by stacking a plurality of first electrodes, a second electrode placed in confronting relation to said plurality of first electrodes and provided in the form of a single electrode with respect to said plurality of first electrodes, fluorescent layers and insulation layers placed in confronting relation to said first electrodes between said first electrodes and said second electrode; and a judgment unit for making a judgment which of said plurality of first electrodes has been touched by an operator on the basis of a high-frequency component inputted from said second electrode through the first electrode each time the touch switch is touched by an operator.

2. The EL light emitting touch switch according to claim 1, further comprising:

an EL driving unit connected to said judgment unit for driving said EL light emitting layer for light emitting;

an EL driving power supply connected between said second electrode and said EL driving unit;

a high-frequency signal source connected in series between said EL driving power supply and a ground electric potential for outputting a signal with a higher frequency than that of said EL driving power supply;

a first filter connected between each of said first electrodes and said EL driving power supply and made to pass an output of said EL driving power supply; and a second filter connected between each of said first electrodes and said judgment unit and made to pass an output of said high-frequency signal source.

3. The EL light emitting touch switch according to claim 2, wherein said high-frequency component has a frequency that is at least 100 times a frequency of the EL driving power supply.

4. The EL light emitting touch switch according to claim 2, wherein said EL driving power supply is operated in conjunction with a light switch of an automobile.

5. The EL light emitting touch switch according to claim 1, further comprising:

an EL driving unit connected to said judgment unit for driving said EL light emitting layer for light emitting;

an EL driving power supply connected between said second electrode and said EL driving unit; and a high-frequency signal source connected between said second electrode and said judgment unit for outputting a signal with a higher frequency than that of said EL driving power supply, said EL driving unit having a function as an on-off switch which repeatedly controls a connection state on-off between said first electrodes and said EL driving power supply, and the judgment on the touch manipulation by the operator being made on the basis of a variation of a high-frequency signal from said high-frequency signal source when said on-off switch is during an off state.

6. The EL light emitting touch switch according to claim 5, wherein said high-frequency component has a frequency that is at least 100 times a frequency of said EL driving power supply.

7. The EL light emitting touch switch according to claim 5, wherein said EL driving power supply is operated in conjunction with a light switch of an automobile.

8. The EL light emitting touch switch according to claim 1, further comprising:

an EL driving unit connected to said judgment unit for driving said EL light emitting layer for light emitting;

an EL driving power supply connected between said second electrode and said EL driving unit for driving said EL light emitting layer for light emitting and for generating a rectangular wave;

a first filter connected between each of said first electrodes and said EL driving power supply for passing an output of said EL driving power supply; and a second filter connected between each of said first electrodes and said judgment unit.

9. The EL light emitting touch switch according to claim 8, wherein said high-frequency component has a frequency that is at least 100 times a frequency of said EL driving power supply.

10. The EL light emitting touch switch according to claim 8, wherein said EL driving power supply is operated in conjunction with a light switch of an automobile.

11. The EL light emitting touch switch according to claim 1, wherein said judgment unit makes the judgment as to which of said plurality of first electrodes has been touched by an operator on the basis of whether or not an attenuation state of said high-frequency component has exceeded a predetermined threshold.

* * * * *